United States Patent
Bayless et al.

(10) Patent No.: US 10,971,471 B2
(45) Date of Patent: Apr. 6, 2021

(54) METHODS AND SYSTEMS FOR MANUFACTURING SEMICONDUCTOR DEVICES

(71) Applicant: Micron Technology, Inc., Boise, ID (US)

(72) Inventors: Andrew M. Bayless, Boise, ID (US); Cassie L. Bayless, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/236,441

(22) Filed: Dec. 29, 2018

(65) Prior Publication Data
US 2020/0212001 A1   Jul. 2, 2020

(51) Int. Cl.
*H01L 23/00* (2006.01)

(52) U.S. Cl.
CPC .............. *H01L 24/75* (2013.01); *H01L 24/81* (2013.01); *H01L 24/83* (2013.01); *H01L 24/91* (2013.01); *H01L 24/16* (2013.01); *H01L 24/32* (2013.01); *H01L 24/73* (2013.01); *H01L 2224/16145* (2013.01); *H01L 2224/32145* (2013.01); *H01L 2224/73204* (2013.01); *H01L 2224/75251* (2013.01); *H01L 2224/75252* (2013.01); *H01L 2224/75253* (2013.01); *H01L 2224/75262* (2013.01); *H01L 2224/75283* (2013.01); *H01L 2224/75301* (2013.01); *H01L 2224/81005* (2013.01); *H01L 2224/81203* (2013.01); *H01L 2224/81224* (2013.01); *H01L 2224/83005* (2013.01); *H01L 2224/83203* (2013.01); *H01L 2224/83224* (2013.01)

(58) Field of Classification Search
None
See application file for complete search history.

(56) References Cited

U.S. PATENT DOCUMENTS

| | | | | |
|---|---|---|---|---|
| 6,353,202 | B1* | 3/2002 | Grotsch | H01L 24/83 219/121.63 |
| 2012/0319268 | A1* | 12/2012 | Kagimoto | H01L 24/29 257/734 |
| 2013/0270230 | A1* | 10/2013 | Cheung | H01L 24/75 219/121.6 |
| 2016/0276195 | A1* | 9/2016 | Huska | H01L 21/681 |

* cited by examiner

Primary Examiner — Steven M Christopher
(74) Attorney, Agent, or Firm — Perkins Coie LLP

(57) ABSTRACT

A semiconductor manufacturing system comprises a laser and a heated bond tip and is configured to bond a die stack in a semiconductor assembly. The semiconductor assembly includes a wafer, manufacture from a material that is optically transparent to a beam emitted by the laser and configured to support a die stack comprising a plurality of semiconductor dies. A metal film is deposited on the wafer and heatable by the beam emitted by the laser. The heated bond tip applies heat and pressure to the die stack, compressing the die stack between the heated bond tip and the metal film and thermally bonding dies in the stack by heat emitted by the heated bond tip and the metal film when the metal film is heated by the beam emitted from the laser.

20 Claims, 5 Drawing Sheets

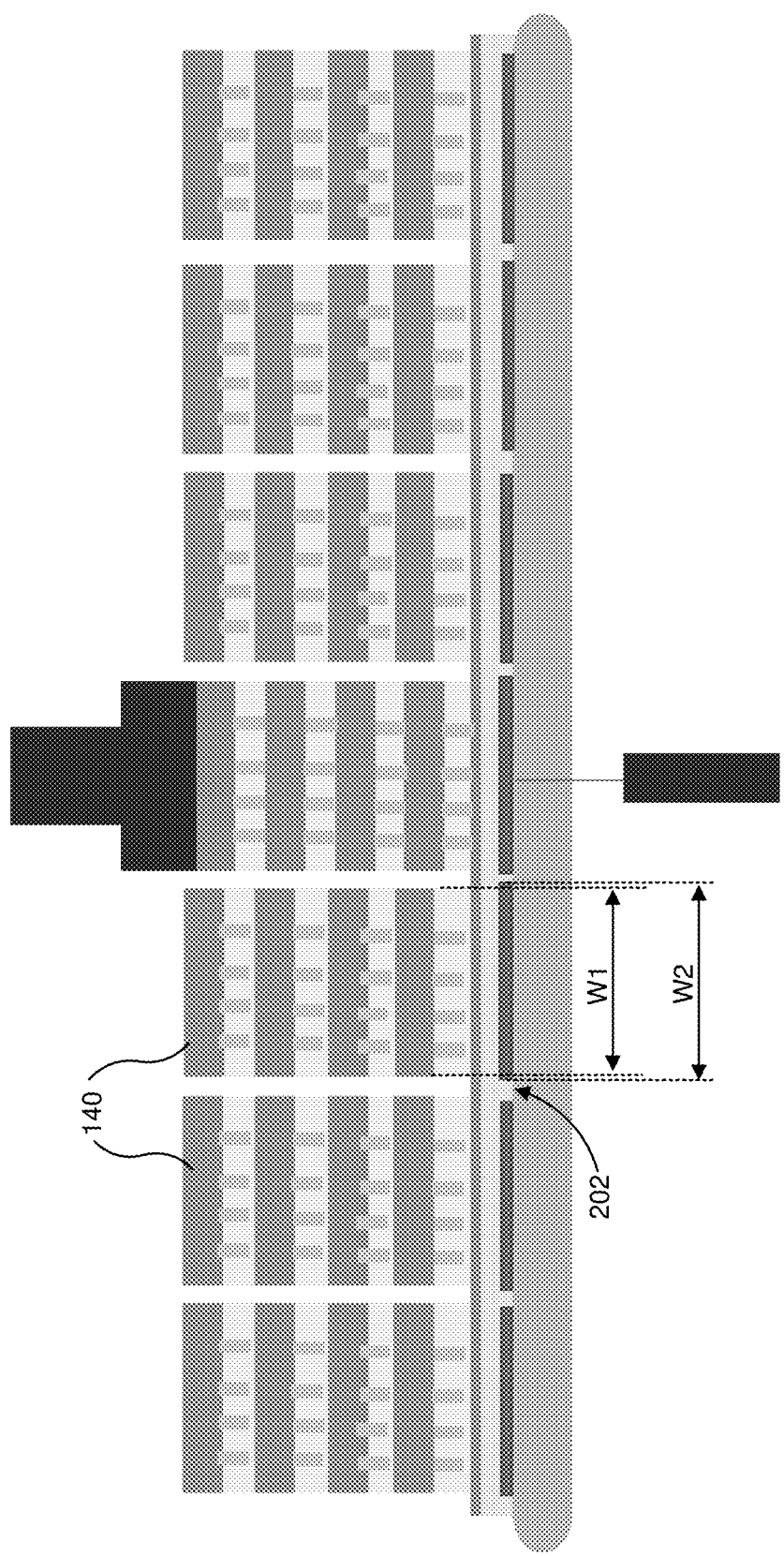

METHODS AND SYSTEMS FOR MANUFACTURING SEMICONDUCTOR DEVICES

TECHNICAL FIELD

The present disclosure relates generally to semiconductor devices, and in particular to methods and systems for manufacturing semiconductor devices.

BACKGROUND

Packaged semiconductor dies, including memory chips, microprocessor chips, and imager chips, typically include a semiconductor die mounted on a substrate and encased in a protective covering. One technique for manufacturing packaged semiconductor dies is thermocompression bonding, which uses simultaneous heat and pressure to bond components together. When gang bonding a die stack, however, a large temperature gradient through the die stack can cause irregular bonding through the stack. Solder connections near a top of the stack, for example, can be over-pressed, while connections near a bottom of the stack may be under-pressed. Over-pressing of the die stack can lead to various problems, including depletion of solder between pair of contacts, leakage of non-conductive film from the perimeter of the stacks, and undesired electrical shorting via leaked solder from adjacent pairs of contacts. Under-pressed portions of the stack, however, may be only partially bonded or not bonded.

BRIEF DESCRIPTION OF THE DRAWINGS

FIGS. 2B-2C illustrate example view of a carrier wafer with a patterned metal film.

DETAILED DESCRIPTION

Figure 1:
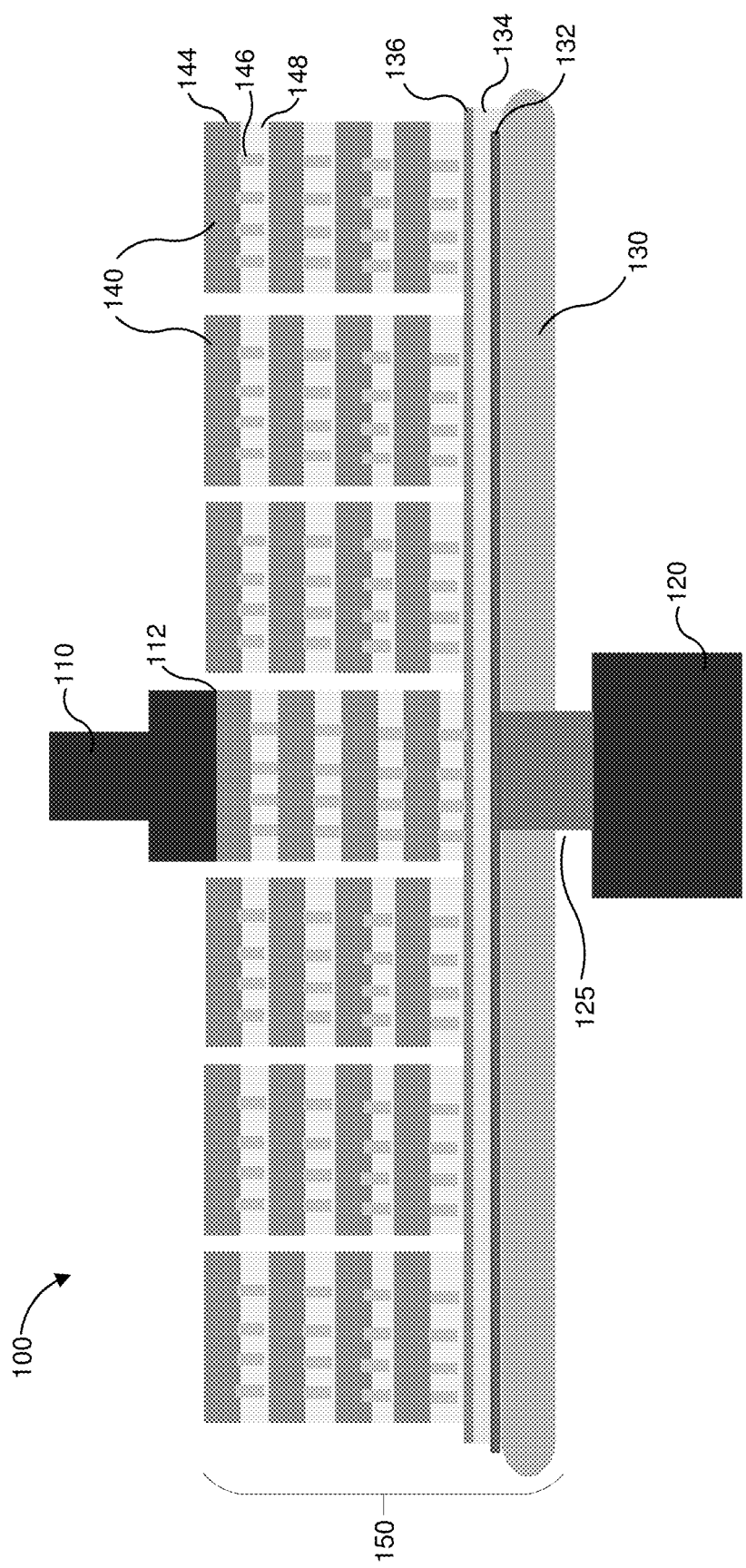
FIG. 1 illustrates an embodiment of a semiconductor manufacturing system.

Specific details of several embodiments of a semiconductor manufacturing system that applies heat to both top and bottom sides of a die stack during thermocompression bonding (TCB), and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-3.

In several of the embodiments described below, a semiconductor manufacturing system includes a heated bond tip and a laser. A beam emitted by the laser is used to heat a metal film deposited on a wafer below a die stack, while the heated bond tip applies heat and pressure to a top of the die stack. The die stack is therefore heated from two directions while under compression, decreasing the temperature gradient through the stack and ensuring more even bonding throughout the stack.

In some embodiments, a semiconductor manufacturing system includes a laser, a semiconductor assembly, and a heated bond tip. The semiconductor assembly includes a wafer comprising a material that is optically transparent to a beam emitted by the laser, where the wafer is configured to support a die stack comprising a plurality of semiconductor dies. A metal film is deposited on the wafer below the die stack and is heatable by the beam emitted by the laser. The heated bond tip is configured to apply heat and pressure to the die stack, and the die stack is compressed between the heated bond tip and the metal film. The plurality of semiconductor dies are thermally bonded by heat emitted by the heated bond tip and the metal film when the metal film is heated by the beam emitted from the laser.

In some embodiments, a method for gang bonding a die stack comprises directing a beam emitted by a laser toward a metal film deposited on a wafer carrying the die stack, the die stack having a bottom side adjacent to the metal film and a top side opposite the bottom side, and the metal film deposited on the wafer below at least a portion of the die stack and configured to transfer heat to a bottom of the die stack. The method further comprises using a heated bond tip to apply heat and pressure at the top side of the die stack to press the die stack against the wafer.

In some embodiments, a semiconductor manufacturing system comprise a laser and a heated bond tip. The laser is configured to emit a laser beam to heat a metal film deposited on a wafer, the wafer supporting a die stack that includes a plurality of semiconductor dies, and the metal film deposited on the wafer below at least a portion of the die stack. The heated bond tip is spaced apart from the laser and configured to apply heat and pressure to a top of the die stack to bond the plurality of semiconductor dies in the die stack.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 illustrates an embodiment of a semiconductor manufacturing system 100, according to one embodiment. As shown in FIG. 1, the semiconductor manufacturing system 100 can include a bond tip 110 and a laser 120 spaced apart from each other. A semiconductor assembly 150 can be placed between the bond tip 110 and the laser 120 and bonded by the bond tip 110 and a beam 125 emitted by the laser 120.

The semiconductor assembly 150 comprises a carrier wafer 130 and one or more die stacks 140. The carrier wafer 130, which can be constructed from glass or a semiconductor such as silicon or gallium arsenide, supports the one or more die stacks 140.

Each die stack 140 can include multiple stacked dies 144, a plurality of interconnects 146, and an adhesive 148. The dies 144 can include any of a variety of types of semiconductor dies, such as memory dies (e.g., a dynamic random access memory (DRAM) device, a NAND Flash memory device, a static random access memory (SRAM) device, or a NOR memory device), a processor, a logic die, a complementary metal oxide semiconductor (CMOS) image sensor, or a system-on-a-chip comprising multiple devices such as a processor, logic, and memory. Each die 144 in the die stack 140 can be the same type of die, or the die stacks 140 can each include two or more types of dies. The adhesive 148 attaches adjacent dies 144 to each other, and comprises, for example, an uncured or partially cured underfill material.

One or more interconnects 146 extend vertically between dies 144 in the stack 140 and electronically couple the dies 144. The die stack 140 can include a smaller or greater number of interconnects 146 than shown in FIG. 1. For example, the die stack 140 can include tens, hundreds, thousands, or more interconnects 146 arrayed between the semiconductor dies. A bond material (not shown) can bond each interconnect 146 to a die 144 or another interconnect. The bond material, comprising, for example, solder, tin-silver, or another bond material, can be heated and compressed by the semiconductor manufacturing system 100 to form electrical and/or mechanical connections between the dies 144. For example, some of the interconnects 146 can be electrically inactive and can provide structural support to the die stack 140, while other interconnects 146 can be electrically active and provide electrical conduction paths between adjacent dies 144.

The die stacks 140 can be formed on a wafer or substrate 136, which in turn can be attached to the carrier wafer 130 by an adhesive layer 134. The adhesive layer 134 may comprise the same material as the adhesive 148, or a different material. The wafer 136 may be removable from the carrier wafer 130 after bonding of the die stacks 140.

A metal film 132 can be deposited on a top side of the carrier wafer 130. The metal film 132 can comprise a thermally conductive material such as titanium, copper, tungsten, or other materials or combinations of materials that can adhere to the carrier wafer 130. The metal film 132 can be deposited on the carrier wafer 130 by any suitable deposition technique. In various embodiments, patterns can be created in the deposited film by wet or dry etching, for example to separate segments of the film 132. The film 132 can be deposited on the carrier wafer 130, and optionally patterned, before the die stacks 140 are assembled on the wafer 130.

The bond tip 110 applies heat and pressure to the die stacks 140 to bond the dies 144. The bond tip 110 can comprise a material capable of withstanding high pressures and temperatures, and capable of transferring heat to the die stacks 140. One such material can be a metal, but any of a variety of materials such as ceramics, semiconductors, or combinations thereof may be used to construct the bond tip 110.

The bond tip 110 can be actuated to press the die stacks 140 against the carrier wafer 130 to facilitate bonding of the dies 144. A heat source (not shown) provides energy to heat the bond tip 110, and the bond tip 110 can transfer heat to the die stacks 140 when pressed against the stacks. The bond tip 110 has a surface 112 on a side of the tip facing the semiconductor assembly 150. The surface 112 can be flat and substantially parallel to a planar surface of the carrier wafer 130. As shown in FIG. 1, the surface 112 of the bond tip 110 can have a size approximately equal to a top surface area of one die stack 140. However, in other embodiments, the surface 112 may have different surface areas. For example, the surface 112 can have a size approximately equal to the top surface area of multiple die stacks 140, enabling the bond tip 110 to compress multiple stacks 140 simultaneously. Alternatively, the surface 112 can have a size that is less than the top surface area of a die stack 140, and multiple bond tips 110 can be used to compress each stack 140.

The laser 120 emits a laser beam 125 directed at the bottom side of the carrier wafer 130 when the semiconductor assembly is placed in the manufacturing system 100. A wavelength of the laser beam 125 emitted by the laser 120 can be selected such that the carrier wafer 130 is optically transparent to the laser beam 125 and the metal film 132 on the wafer 130 can absorb energy of the beam. For example, if the carrier wafer 130 is a silicon wafer, the laser 120 can emit an infrared beam 125. If the carrier wafer 130 is glass, the laser 120 can emit a beam 125 in the visible light spectrum.

Heat produced by the laser beam 125 can be absorbed by the metal film 132, creating a localized heat source at a bottom side of the die stacks 140. When the die stack 140 is pressed against the carrier wafer 130 by the bond tip 110, the heated metal film 132 can transfer heat to the bottom of the die stack 140. Application of heat to both the top side and bottom side of the die stack 140 can reduce a temperature gradient through the stack, improving bonding of the dies 144.

Figure 2B:
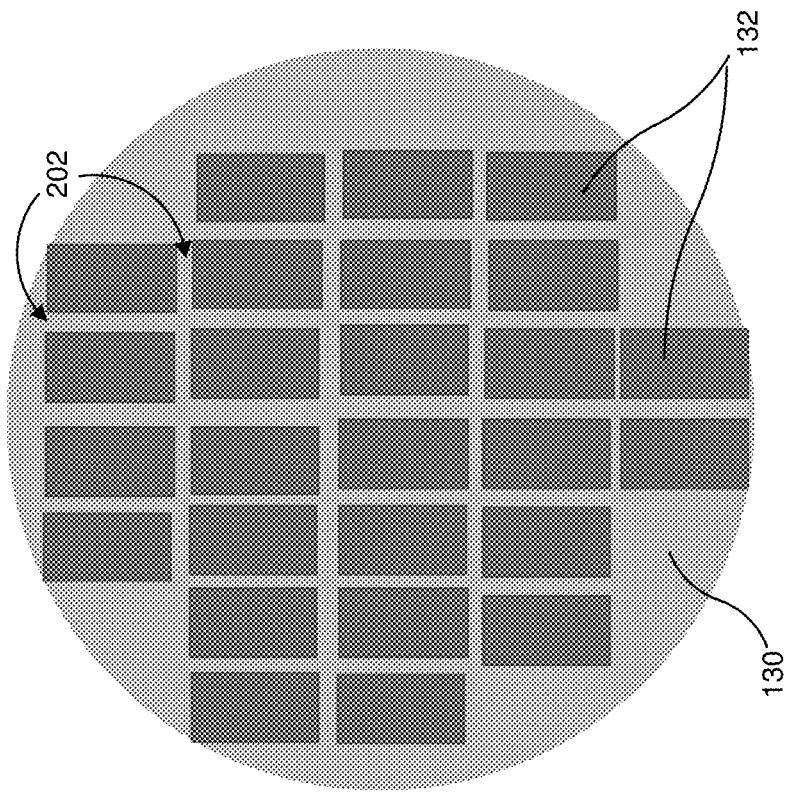
Figure 2A:
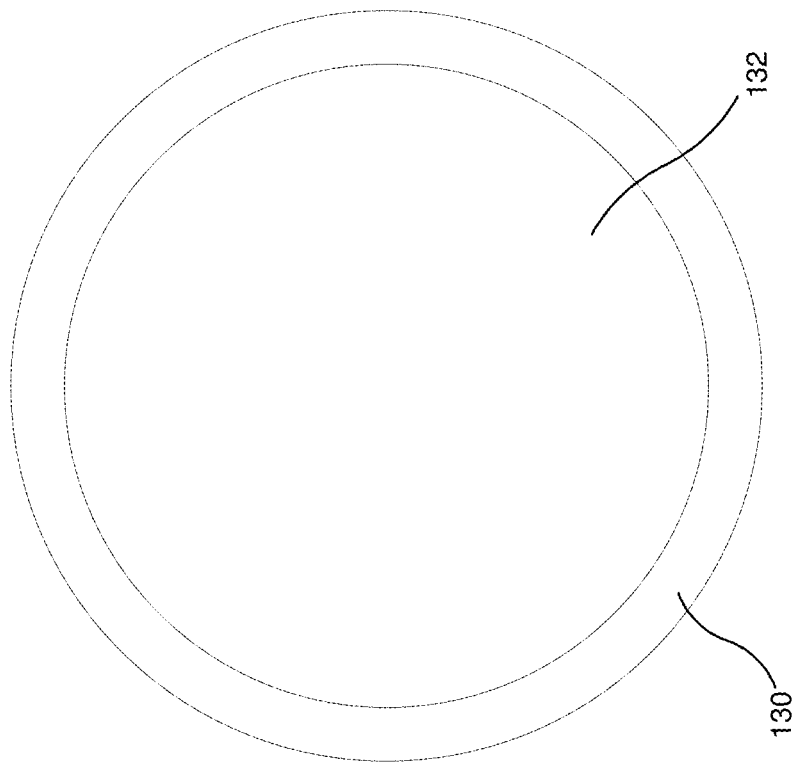
FIG. 2A illustrates an example top view of a carrier wafer with a continuous metal film.

FIG. 1 shows that, in some embodiments, the metal film 132 can comprise a continuous sheet distributed across the top surface of the carrier wafer 130. FIG. 2A illustrates an example top view of the carrier wafer 130 with a continuous metal film 132. However, in other embodiments, the metal film 132 can be deposited across a portion of the carrier wafer 130 or deposited in a pattern with non-contiguous segments of film. FIG. 2B is a top view illustrating an example of a patterned metal film 132, and FIG. 2C is a side view of the embodiment of the metal film 132 shown in FIG. 2B. Segments of the patterned film 132 can be physically separated from each other by gaps 202. The gaps 202 can also thermally isolate (or decrease heat transfer between) segments of the metal film 132, enabling the semiconductor manufacturing system 100 to apply heat locally to a die stack 140 while applying little or no heat to adjacent die stacks. Furthermore, physically isolating segments of the metal film 132 can reduce mechanical stress across the carrier wafer 130 caused by the different material properties of the metal film 132 and the wafer 130. In some embodiments, the gaps 202 are substantially aligned with die streets between the die stacks 140.

As shown in FIG. 2C, the segments of the patterned metal film 132 can have a width that is approximately equivalent to a width of each die stack 140. A first die stack 140 can have a width W1 while a first segment of the metal film 132 can have a width W2. In some embodiments, the width W2 is larger than the width W1 but small enough to leave a gap 202 between the first segment and a second segment of the metal film 132. A depth of the first segment of the metal film 132 (perpendicular to the perspective shown in FIG. 2C) may similarly be larger than a depth of the die stack 140 while maintaining a gap between the first segment and a second segment. When the first segment width W2 is larger than the die stack width W1, the first segment of the metal film 132 can block the laser beam 125 from contacting the die stack 140 and damaging sensitive components of the dies 144.

The carrier wafer 130 may have configurations of the metal film 132 other than those shown in FIGS. 2A-2C, and segments of the metal film 132 may be any of a variety of sizes. For example, each segment of the metal film 132 can have a size approximately equivalent to a size of each interconnect 146, and one film segment 132 can be provided for each interconnect 146. In other cases, segments of the metal film 132 are approximately the size of several interconnects 146 but smaller than a die stack 140, or the segments can have a size that is approximately equivalent to the size of multiple die stacks 140.

FIGS. 3A-3D illustrate one embodiment of a process for bonding die stacks 140 using the semiconductor manufacturing system 100. The process is illustrated with respect to a carrier wafer 130 that has a patterned metal film 132. However, a similar process may be used for embodiments of the metal film 132 that are continuous or patterned in different ways than shown in FIGS. 3A-3D.

Figure 3A:
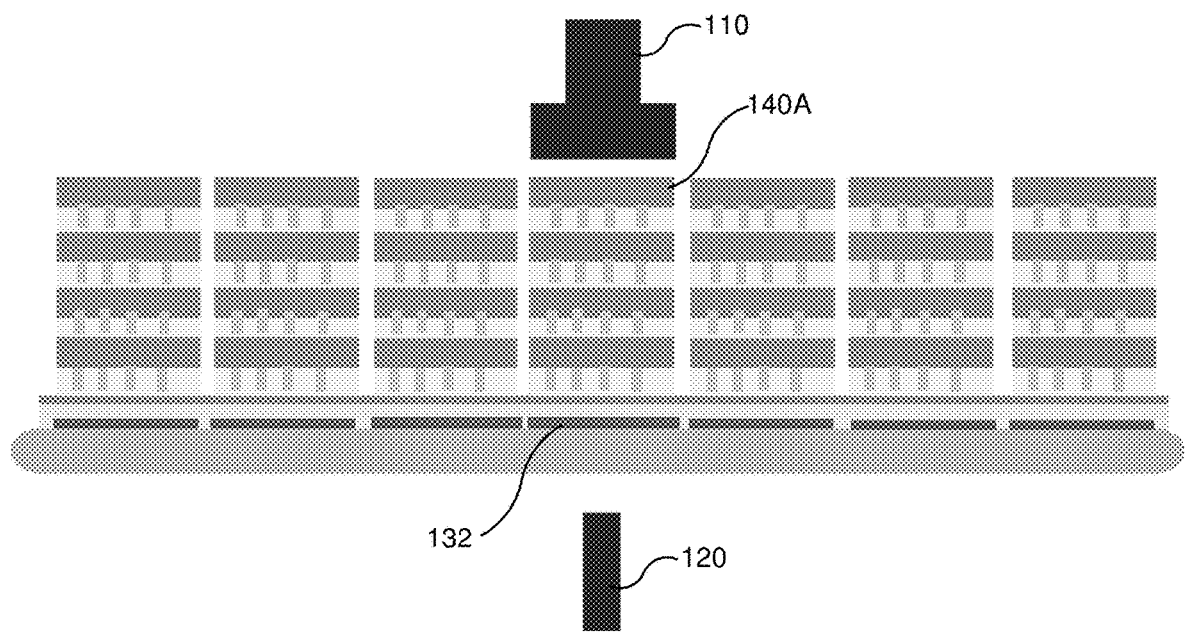
FIGS. 3A-3D illustrate an example process for bonding die stacks.
Figure 3B:
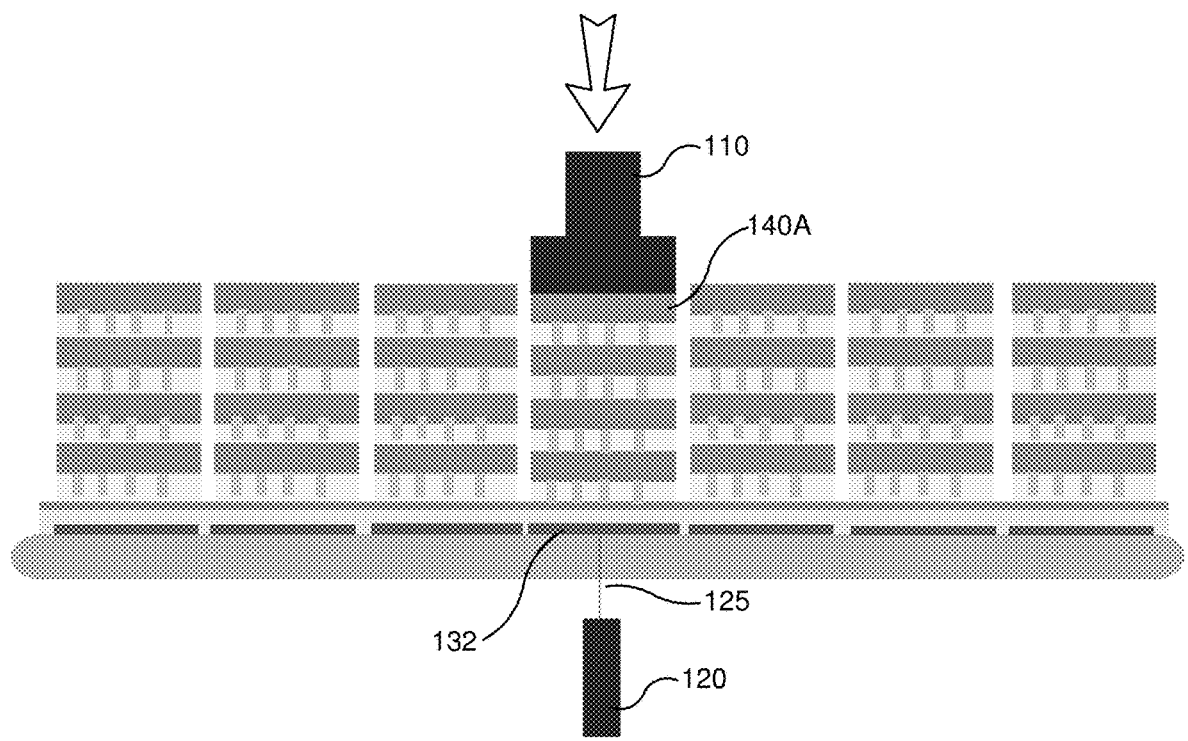

As shown in FIG. 3A, the bond tip 110 and laser 120 can be aligned with a first die stack 140A. FIG. 3B shows that the laser 120 can be turned on to emit a beam 125 towards the metal film 132 below the die stack 140A, and the bond tip 110 can be actuated to compress the stack 140A. The bond tip 110 can compress the stack 140A for specified amount of time determined to allow bonding of the dies 144.

Figure 3C:
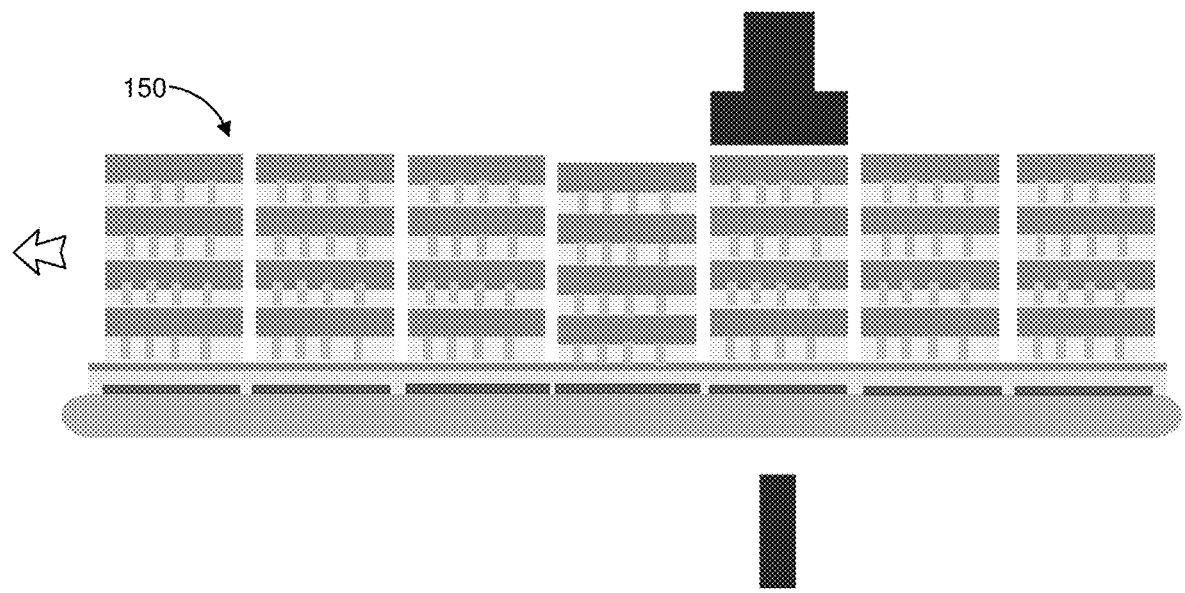

Once the first stack 140A has been bonded, the bond tip 110 and laser 120 can be repositioned to align with a second die stack 140B. FIG. 3C shows that the semiconductor assembly 150 can be shifted horizontally to align the bond tip 110 and laser 120 with the stack 140B. In other embodiments, however, the bond tip 110 and laser 120 can be moved to align with the stack 140B. The laser 120 can in some embodiments be turned off, or its beam blocked, while the laser 120 is moved relative to the semiconductor assembly 150, reducing the likelihood that the laser beam 125 will pass through a gap 202 between metal film segments into sensitive components of the die stacks 140.

Figure 3D:
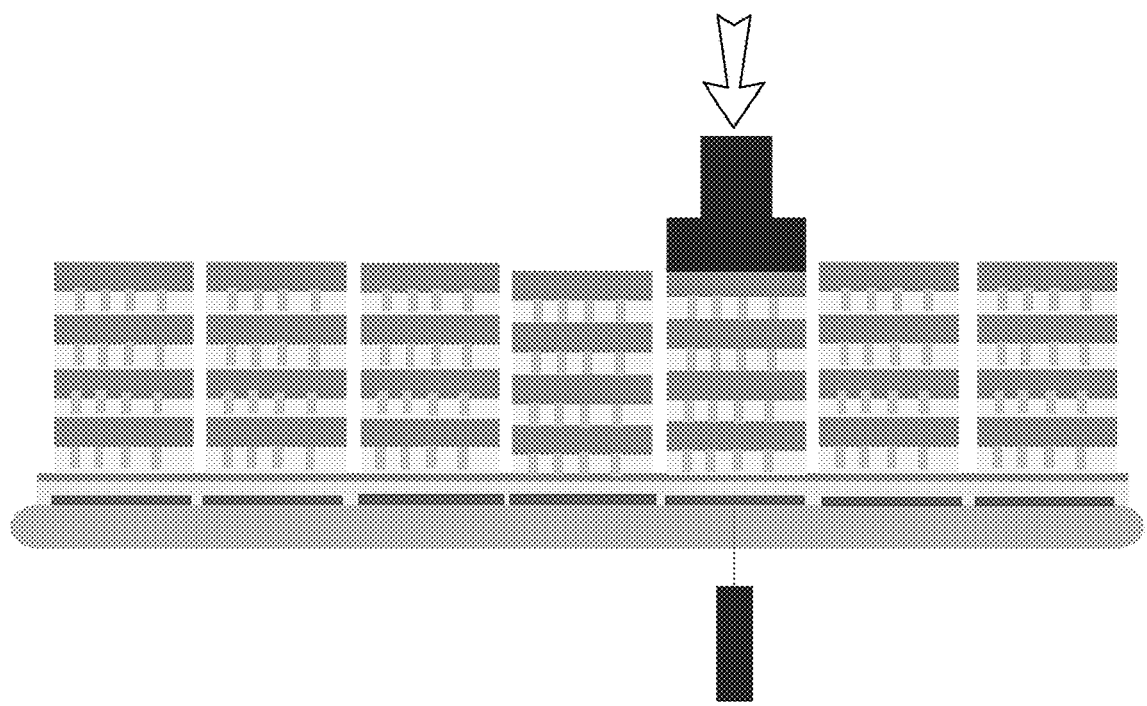

After the bond tip 110 and laser 120 have been aligned with the second die stack 140B as shown in FIG. 3D, the laser 120 can be turned on to emit the beam 125 towards the metal film 132 below the second stack 140B and the bond tip 110 can be actuated to compress the stack 140B. The bond tip 110 can compress the stack 140B for the same amount of time as the first stack 140A was compressed, or for a different amount of time (e.g., if the second stack 140B contains a different number of dies 144 or different components requiring additional or less time to form bonds).

The semiconductor manufacturing system 100 can iterate the steps shown in FIGS. 3A-3D until all die stacks 140 on the wafer 130 have been bonded. In some embodiments, the carrier wafer 130 with metal film 132 can be reused to perform the bonding process on a new set of die stacks 140.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A semiconductor manufacturing system, comprising:
   a laser;
   a semiconductor assembly including:
      a wafer comprising a material that is optically transparent to a beam emitted by the laser, the wafer configured to support a die stack comprising a plurality of semiconductor dies; and
      a metal film deposited on the wafer below the die stack and heatable by the beam emitted by the laser; and
   a heated bond tip configured to apply heat and pressure to the die stack, wherein the die stack is compressed between the heated bond tip and the metal film, and the plurality of semiconductor dies are thermally bonded by heat emitted by the heated bond tip and the metal film when the metal film is heated by the beam emitted from the laser.

2. The semiconductor manufacturing system of claim 1, wherein the metal film comprises a continuous sheet on a surface of the wafer.

3. The semiconductor manufacturing system of claim 1, wherein the metal film comprises a plurality of non-contiguous segments on a surface of the wafer.

4. The semiconductor manufacturing system of claim 3, wherein each segment of the metal film has a width that is equal to a width of the die stack.

5. The semiconductor manufacturing system of claim 3, wherein each segment of the metal film has a width that is greater than a width of the die stack.

6. The semiconductor manufacturing system of claim 3, wherein each segment of the metal film has a width that is less than a width of the die stack.

7. The semiconductor manufacturing system of claim 1, wherein the wafer comprises silicon, and wherein the beam emitted by the laser is an infrared beam.

8. A method for gang bonding a die stack, comprising:
   directing a beam emitted by a laser toward a metal film deposited on a wafer carrying the die stack, the die stack having a bottom side adjacent to the metal film and a top side opposite the bottom side, and the metal film deposited on the wafer below at least a portion of the die stack and configured to transfer heat to a bottom of the die stack; and
   using a heated bond tip to apply heat and pressure at the top side of the die stack to press the die stack against the wafer.

9. The method of claim 8, further comprising:
   moving the laser and bond tip relative to the wafer;
   directing the beam emitted by the laser toward a metal film deposited on the wafer below at least a portion of a second die stack; and
   using the heated bond tip to apply heat and pressure at a top side of the second die stack to press the second die stack against the wafer.

10. The method of claim 9, further comprising turning of the laser prior to moving the laser and the bond tip relative to the wafer.

11. The method of claim 8, further comprising:
    depositing the metal film on the wafer; and
    after depositing the metal film, assembling the die stack on the wafer.

12. The method of claim 11, further comprising etching a pattern into the metal film to generate a plurality of non-contiguous segments of the metal film.

13. The method of claim 8, wherein the wafer comprises silicon, and wherein the beam emitted by the laser is an infrared beam.

14. A semiconductor manufacturing system, comprising:
    a laser configured to emit a laser beam in a first direction to heat a metal film deposited on a wafer, the wafer supporting a die stack that includes a plurality of semiconductor dies, and the metal film deposited on the wafer below at least a portion of the die stack; and
    a heated bond tip spaced apart from the laser and configured to apply heat and pressure in a second direction to a top of the die stack to bond the plurality of semiconductor dies in the die stack, wherein the first direction is opposite the second direction.

15. The semiconductor manufacturing system of claim 14, wherein the metal film comprises a continuous sheet on a surface of the wafer.

16. The semiconductor manufacturing system of claim 14, wherein the metal film comprises a plurality of non-contiguous segments on a surface of the wafer.

17. The semiconductor manufacturing system of claim 16, wherein each segment of the metal film has a width that is equal to a width of the die stack.

18. The semiconductor manufacturing system of claim 16, wherein each segment of the metal film has a width that is greater than a width of the die stack.

19. The semiconductor manufacturing system of claim 16, wherein each segment of the metal film has a width that is less than a width of the die stack.

20. The semiconductor manufacturing system of claim 14, wherein the wafer comprises silicon, and wherein the beam emitted by the laser is an infrared beam.

* * * * *